United States Patent [19]
Cozad

Patent Number: 6,160,243
Date of Patent: Dec. 12, 2000

[54] APPARATUS AND METHOD FOR CONTROLLING FLUID IN A MICROMACHINED BOILER

[75] Inventor: Bradford Allen Cozad, Newark, Calif.

[73] Assignee: Redwood Microsystems, Inc., Menlo Park, Calif.

[21] Appl. No.: 09/161,185

[22] Filed: Sep. 25, 1998

[51] Int. Cl.$^7$ .............................. F27D 11/00; F16K 31/00
[52] U.S. Cl. ................................. 219/439; 251/11
[58] Field of Search ................................. 219/439, 438, 219/436, 432, 407; 204/601; 251/11; 137/505, 501; 430/326; 60/512; 392/439, 304

[56] References Cited

U.S. PATENT DOCUMENTS

| | | | |
|---|---|---|---|
| 3,538,744 | 11/1970 | Karasek | 73/23.1 |
| 4,347,976 | 9/1982 | Jakobsen | 236/68 B |
| 4,637,071 | 1/1987 | Pitt et al. | 455/603 |
| 4,792,977 | 12/1988 | Anderson et al. | 381/68.4 |
| 4,824,073 | 4/1989 | Zdeblick | 251/11 |
| 4,935,040 | 6/1990 | Goedert | 55/197 |
| 5,333,831 | 8/1994 | Barth et al. | 251/11 |
| 5,649,423 | 7/1997 | Sniegowski | 60/531 |
| 5,839,467 | 11/1998 | Saaski et al. | 137/501 |
| 5,846,396 | 12/1998 | Zanzucchi et al. | 204/601 |
| 5,865,417 | 2/1999 | Harris el al. | 251/11 |
| 5,966,501 | 10/1999 | Miller et al. | 392/458 |

*Primary Examiner*—Teresa Walberg
*Assistant Examiner*—Daniel Robinson
*Attorney, Agent, or Firm*—William S. Galliani; Pennie & Edmonds LLP

[57] ABSTRACT

A micromachined fluid control apparatus includes a micromachined boiler with a thermally conductive housing that has a housing exterior surface and a housing interior surface. The housing interior surface defines an interior void that has a fluid positioned within it. A heat source is incorporated with the housing exterior surface. The heat source selectively generates heat that is conducted through the thermally conductive housing so as to selectively expand the fluid in a predetermined manner. A load resistor may be positioned within the thermally conductive housing. Current may be driven through the load resistor in a predetermined manner to further control the selective expansion of the fluid.

12 Claims, 5 Drawing Sheets

APPARATUS AND METHOD FOR CONTROLLING FLUID IN A MICROMACHINED BOILER

BRIEF DESCRIPTION OF THE INVENTION

This invention relates generally to micromachined fluid control devices, such as valves and pumps. More particularly, this invention relates to a thermally conductive boiler controlled by a heat source positioned outside of the boiler chamber.

BACKGROUND OF THE INVENTION

Micromachined devices (also called micromechanical devices or microelectro-mechanical devices) are small (micron scale) machines that are constructed using semiconductor processing techniques. Micromachines include a variety of devices, such as fluid control devices (e.g., valves and pumps), motors, and gear trains analogous to conventional macroscale machinery. As used herein, the term micromachine refers to any three-dimensional object that is at least partially constructed in reliance upon semiconductor processing techniques.

FIG. 1 illustrates a micromachined valve 20 constructed in accordance with the prior art. The valve 20 includes three major components: a heat insulating substrate 22, a deformable membrane 24, and a fluid routing substrate 26. The heat insulating substrate 22 may be formed of Pyrex, while the deformable membrane may be formed of silicon. A working fluid 28 is positioned in a void formed between the heat insulating substrate 22 and the deformable membrane 24. A thin-film heater 30 is formed on the heat insulating substrate 22. More particularly, as shown in FIG. 1, the thin-film heater 30 is attached to an interior surface of the valve 20. An electrical contact 32 and an electrical feedthrough 34 are used to supply current to the thin-film heater 30. Although not shown for the purpose of simplicity, at least one additional contact and electrical feedthrough are also used. FIG. 1 also shows a seal cap 36 which may be used to deliver the working fluid 28 into the valve 20.

The deformable membrane 24 is positioned on a pedestal 38 and carries a valve seat 40. The valve seat 40 rests over a valve opening 42. Thus, the apparatus of FIG. 1 represents a normally closed valve. That is, the valve of FIG. 1 is closed when no power is applied to it.

FIG. 2 illustrates the valve of FIG. 1 in an open state after power is applied to it. When current is applied across the thin-film resistor 30, the working fluid 28 is heated and subsequently expands, thereby deforming the deformable membrane 24. As a result, fluid can pass through the valve opening 42, as shown with arrow 44.

Those skilled in the art will recognize a number of shortcomings associated with the apparatus of FIGS. 1 and 2. First, the prior art device is relatively slow because it is relatively time-consuming to heat the working fluid 28 with the thin-film heater 30. In addition, the prior art device is relatively expensive to manufacture and test. A significant portion of this expense is associated with the thin-film heater 30. The thin-film heater 30 is inherently expensive to manufacture. Testing of the thin-film structure is difficult because of the position of the thin-film heater in the interior of the valve. Furthermore, it is relatively expensive to provide a thin-film heater with refined temperature and current control capabilities.

In view of the foregoing, it would be highly desirable to provide an improved micromachined fluid control device. Such a device should provide improved speed in controlling the temperature of the working fluid. In addition, such a device should be relatively inexpensive to manufacture and test.

SUMMARY OF THE INVENTION

The apparatus of the invention is a micromachined boiler with a thermally conductive housing that has a housing exterior surface and a housing interior surface. The housing interior surface defines an interior void that has a fluid positioned within it. A heat source is incorporated with the housing exterior surface. The heat source selectively generates heat that is conducted through the thermally conductive housing so as to selectively expand the fluid in a predetermined manner. A load resistor may be positioned within the thermally conductive housing. Current may be driven through the load resistor in a predetermined manner to further control the selective expansion of the fluid.

The method of the invention includes the step of enclosing a working fluid within a micromachined boiler with a thermally conductive housing. The thermally conductive housing is subsequently heated to control the expansion of the working fluid within the micromachined boiler. Current may be selectively driven through a load resistor positioned within the thermally conductive housing to control the expansion of the working fluid within the micromachined boiler.

The combination of the thermally conductive boiler housing and externally positioned heat source provides rapid proportional control of the working fluid within the boiler. The heat source of the invention is relatively easy to assemble. The position of the heat source also facilitates testing. The heat source may be implemented as a low-cost, externally mounted controller. Alternately, the heat source may be integrally formed within the boiler. In either embodiment, the heat source is an external heat source since it is external to the interior of the boiler chamber. The thermally conductive housing efficiently exploits all thermal energy associated with the heat source.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 3:
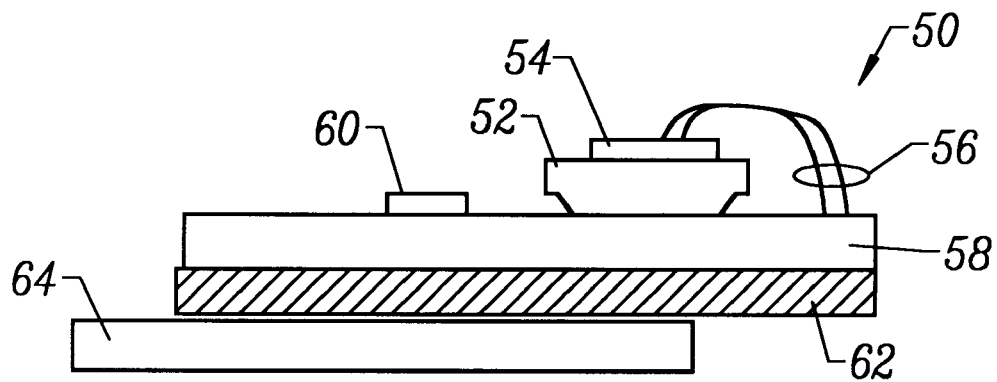
FIG. 3 illustrates a micromachined fluid control apparatus in accordance with an embodiment of the invention.

FIG. 3 illustrates a micromachined fluid control apparatus 50 in accordance with an embodiment of the invention. The apparatus 50 includes a micromachined boiler 52. The micromachined boiler 52 includes a thermally conductive housing that defines an interior void (shown in subsequent figures). A heat source 54 is incorporated with the exterior of the micromachined boiler 52. The heat source 54 may either be a discrete device attached to the boiler 52, as shown in FIG. 3, or it may be a device integrated into the boiler. In either embodiment, the heat source is external to the interior chamber defined by the boiler. Heater bond wires 56 are attached to the heat source 54.

The micromachined boiler 52 is preferably positioned on an insulating substrate 58, which may have a fluid seal cap 60. The insulating substrate may be formed of Pyrex. A deformable membrane 62 is attached to the insulating substrate 58. By way of example, the deformable membrane 62 may be formed of silicon. A fluid routing substrate 65 is attached to the deformable membrane 62. The deformable membrane 62, the fluid routing substrate 65, and the insulating substrate 58 may be of the type known in the art. The invention is directed toward the micromachined boiler 52 and its associated heater 54. Those skilled in the art will appreciate that any number of valve configurations or other external devices may be utilized in connection with the disclosed boiler 52.

The micromachined boiler 52 is formed of a thermally conductive material. As used herein, the term thermally conductive material refers to a material with a thermal conductivity of at least 40 W/m K, preferably at least 80 W/m K. The invention has been implemented with a silicon micromachined boiler 52. In this embodiment, standard semiconductor processing techniques are used to fabricate individual halves of the boiler cylinder. As discussed below, a load resistor may be formed within the individual halves of the cylinder, or may be placed at the interface between the halves. The load resistor may be an implanted device, a thin-film device, or the like. The individual halves are sealed to form a closed chamber.

The external heater 54 provides a resistive heat source. Preferably, the external heater 54 includes a control circuit to reduce heat output from the heater 54 when the heat output reaches a predetermined temperature. Alternately, the external heater 54 includes a control circuit to reduce current flow through the heater 54 when the current flow reaches a predetermined value. By way of example, the external heater 54 has been implemented with a MC7805 integrated circuit sold by Motorola, Inc., Schaumburg, Ill.

Figure 1:
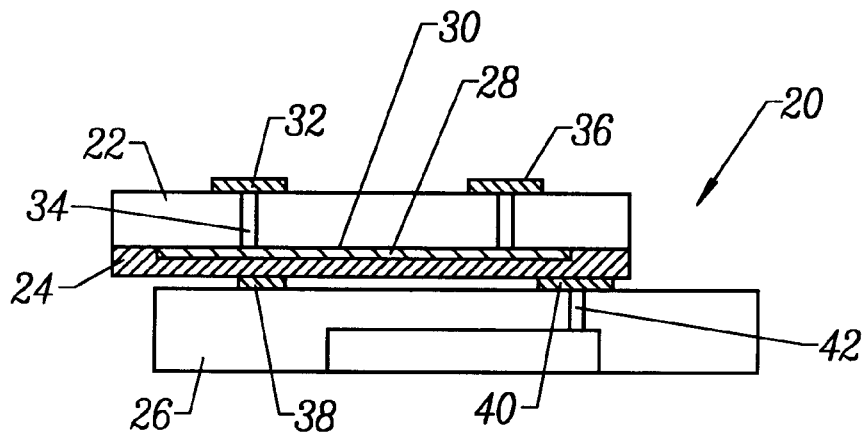
FIG. 1 illustrates a prior art valve that uses internal heating of a working fluid to control the valve state.
Figure 2:
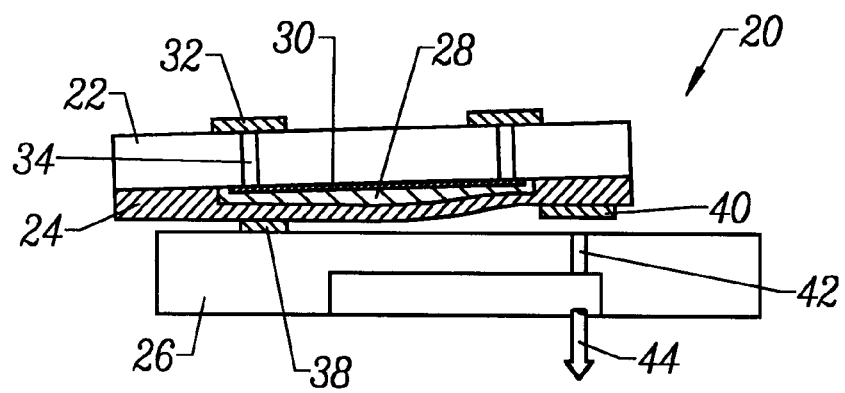
FIG. 2 illustrates the prior art valve of FIG. 1 in an open state.

Those skilled in the art will recognize a number of benefits associated with the apparatus of FIG. 3. First, the boiler 52 is completely formed from a thermally conductive material. Thus, any heat associated with the heater 54 is conveyed to the working fluid within the boiler 52. This results in rapid heating of the working fluid. Observe that with the apparatus of FIGS. 1 and 2, the thin-film heater 30 is formed on an insulating substrate 22.

The apparatus 50 of FIG. 3 is also advantageous because it uses an externally positioned heater 54. A discrete external heater provides a low-cost implementation. An integrated external heater provides a compact and efficient implementation.

Figure 4:
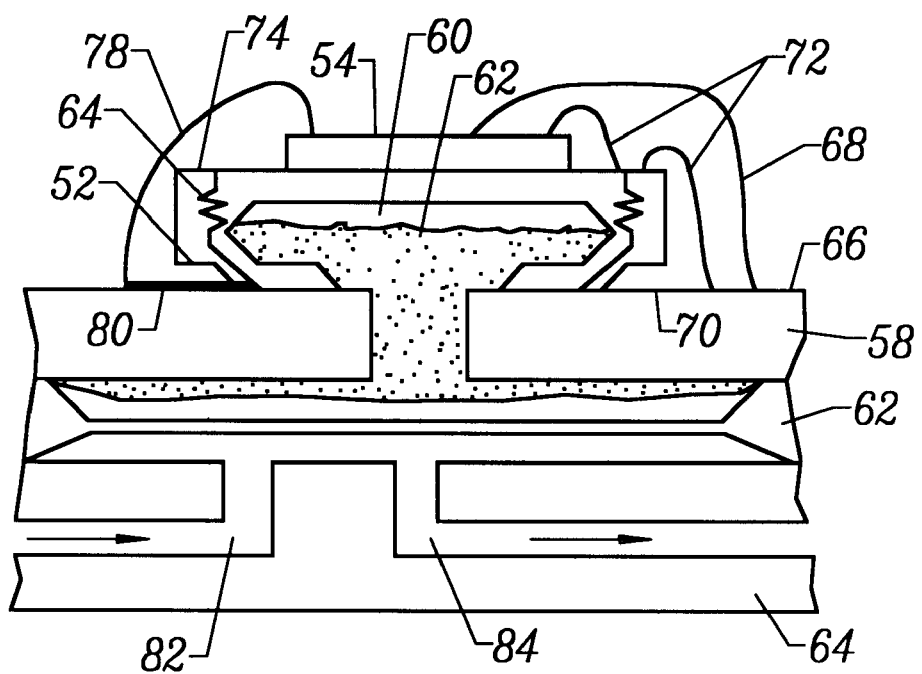
FIG. 4 is an enlarged cross-sectional view of a micromachined fluid control apparatus in accordance with an embodiment of the invention.

The operation and benefits of the invention are more fully appreciated with reference to FIG. 4. FIG. 4 is an enlarged cross section of the "normally open" embodiment of the device. The figure illustrates the boiler 52, which defines a boiler chamber 61. A working fluid 63 is positioned within the chamber 61. In the embodiment of FIG. 4, a load resistor 64 is positioned within the wall of the boiler 52.

A voltage input bond pad 66 is positioned on the insulating substrate 58. A voltage input bond wire 68 extends from the bond pad 66 to the top of the heater 54. A ground bond pad 70 is also positioned on the insulating substrate 58. Ground bond wires 72 are attached to the boiler 52 and the heater 54. A ground plane 74 is formed on the top of the boiler 52. An output bond wire 78 extends from the top of the heater 54 to an output lead 80, which is electrically linked with the load resistor 64.

Figure 5:
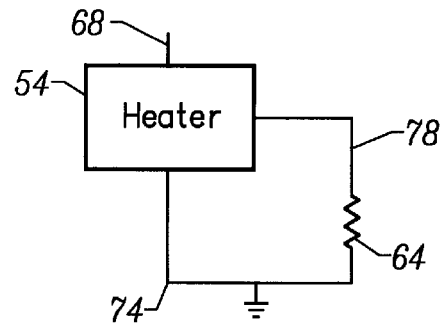
FIG. 5 illustrates an electrical circuit corresponding to the apparatus of FIG. 4.

FIG. 5 illustrates an electrical circuit corresponding to the device of FIG. 4. FIG. 5 illustrates the voltage input bond wire 68 being applied to the heater 54. The output bond wire 78 from the heater is connected to the load resistor 64, which is connected to ground at its other end. The heater 54 is also grounded via the ground bond wire 72. The input voltage applied from node 68 is applied to the heater 54, causing the heater to generate resistive heat, which is conducted to the working fluid 63. Resistive heat is also generated by the load resistor 64.

The applied heat causes the working fluid 63 to expand. As a result, the deformable membrane 62 distends to block the output port 84 of the fluid routing substrate 64. Control of the working fluid 63 provides proportional control of the valve. Those skilled in the art will appreciate that the boiler of the invention can be used with any number of fluid control paths, valves, or pumps. The configuration of FIG. 4 is solely provided by way of example.

Figure 6:
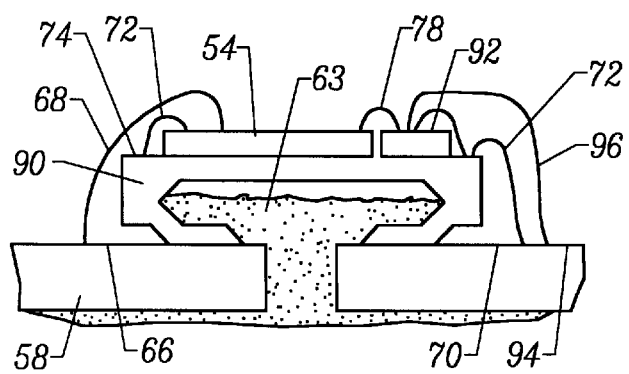
FIG. 6 is an enlarged cross-sectional view of a micromachined fluid control apparatus in accordance with another embodiment of the invention.

FIG. 6 illustrates another embodiment of the micromachined boiler of the invention. The apparatus of FIG. 6 does not include a load resistor. Instead, a load transistor 92 is provided. The transistor is used as a load and a secondary heating source. The load transistor 92 allows dynamic output loading. The transistor 92 may be mounted onto the boiler 54, manufactured into the boiler 54, or mounted remotely.

The boiler 90 of FIG. 6 encloses a working fluid 63. The boiler 90 is positioned on an insulating substrate 58. A voltage input bond pad 66 is positioned on the substrate 58. A voltage input bond wire 68 extends from the bond pad 66 to the top of the heater 54. A ground bond pad 70 is also positioned on the substrate 58. Ground bond wires 72 extend to the ground plane 74, the load transistor 92, and the heater 54. The load transistor 92 is connected to a control input pad 94 via a control input bond wire 96. An output bond wire 78 links an output node of the heater 54 to the load transistor 92.

Figure 7:
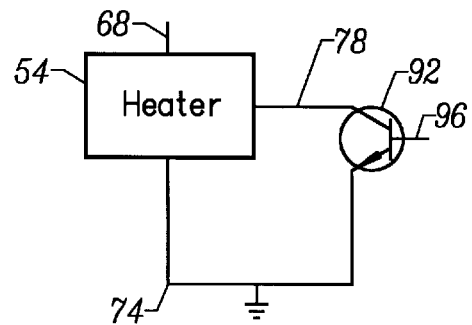
FIG. 7 illustrates an electrical circuit corresponding to the apparatus of FIG. 6.

FIG. 7 illustrates an electrical circuit corresponding to the device of FIG. 6. An output node of the heater 54 is connected to the load transistor 92. The control input bond wire 96 is attached to the gate or base of the transistor 92. In this embodiment, the heater 54 provides heat to the working fluid, as does the transistor 92.

Figure 8:
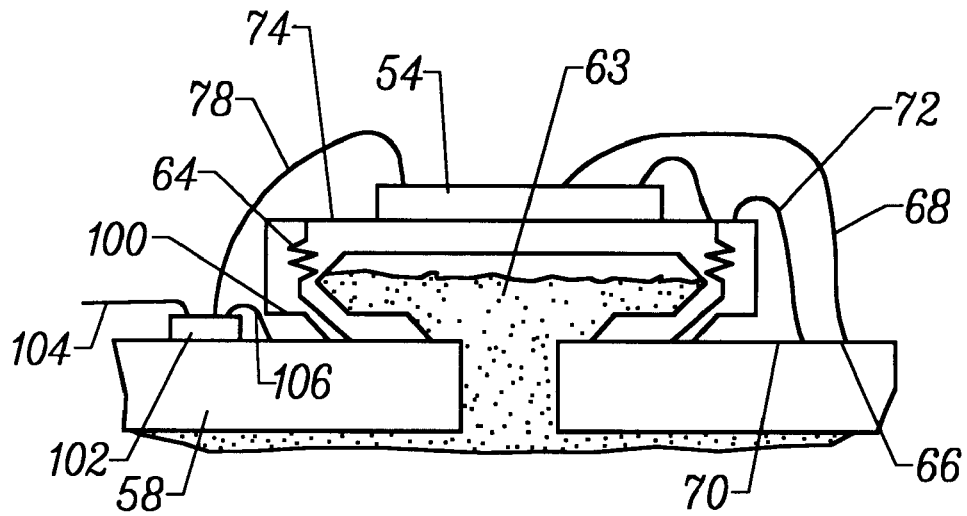
FIG. 8 is an enlarged cross-sectional view of a micromachined fluid control apparatus in accordance with another embodiment of the invention.
Figure 9:
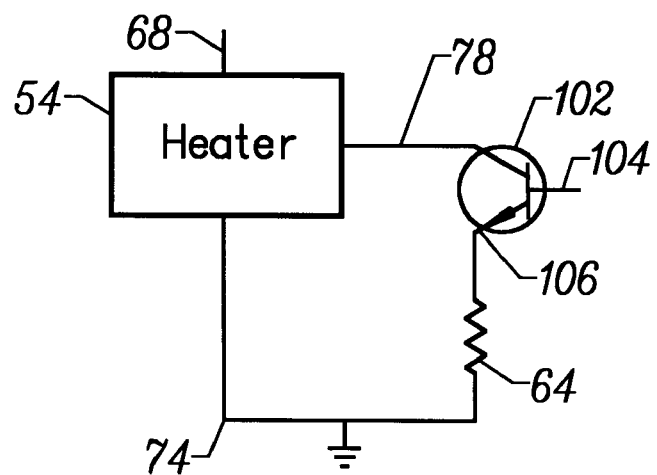
FIG. 9 illustrates an electrical circuit corresponding to the apparatus of FIG. 8.

FIG. 8 illustrates another embodiment of the invention. In this embodiment, the boiler 100 includes an internal load resistor 64 and an externally mounted transistor 102. FIG. 9 is a schematic corresponding to the device of FIG. 8. A control input bond wire 104 is attached to the gate or base of transistor 102. A transistor output lead 106 is electrically connected to the load resistor 64. Thus, in this embodiment, the transistor 102 is used as a power control device, allowing for fast, efficient heating.

Figure 10:
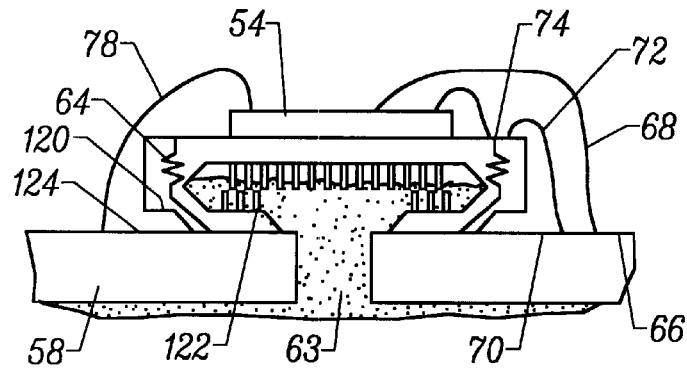
FIG. 10 is an enlarged cross-sectional view of a micromachined fluid control apparatus in accordance with another embodiment of the invention.
Figure 11:
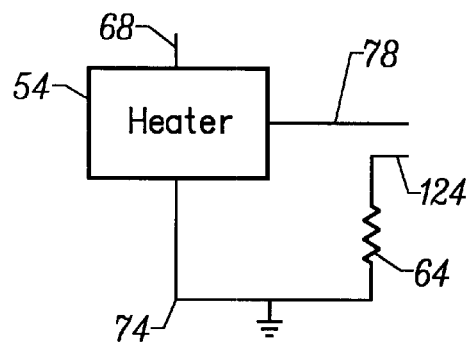
FIG. 11 illustrates an electrical circuit corresponding to the apparatus of FIG. 10.

FIG. 10 illustrates still another embodiment of the invention. In this embodiment, the boiler 120 includes a set of heat transfer fins 122 positioned within the boiler interior chamber. The heat transfer fins 122 improve the heat transfer characteristics of the device. A separate resistor input lead 124 is provided in this embodiment to establish separate control of the load resistor 64. FIG. 11 illustrates an electrical schematic corresponding to the device of FIG. 10.

Figure 12:
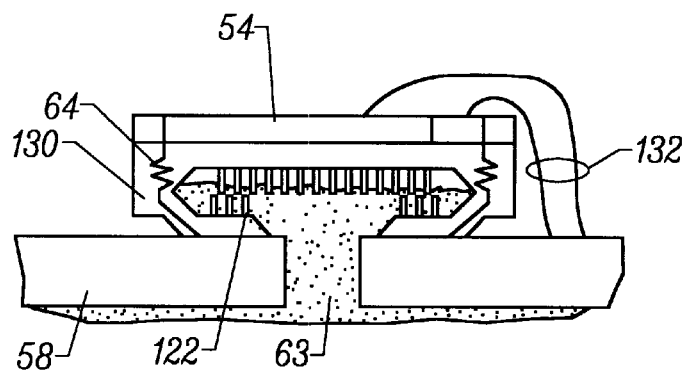
FIG. 12 illustrates a micromachined fluid control apparatus in accordance with another embodiment of the invention.

FIG. 12 illustrates a boiler 130 in which the heater 54 is integral with the boiler housing. Bond wires 132 are used to establish the required electrical connections. The device of FIG. 12 operates consistently with the previously disclosed embodiments of the invention.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed. Obviously, many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A micromachined fluid control apparatus, comprising:
a micromachined boiler including a thermally conductive housing with a housing exterior surface and a housing interior surface defining an interior void with a fluid positioned therein; and
a heat source positioned on said housing exterior surface, said heat source selectively generating heat that is conducted through said thermally conductive housing to selectively expand said fluid in a predetermined manner to control fluid flow;
wherein said thermally conductive housing includes a plurality of heat transfer fins positioned within said interior void.

2. The micromachined fluid control apparatus of claim 1 wherein said heat source is a discrete device positioned on said housing exterior surface.

3. The micromachined fluid control apparatus of claim 1 wherein said thermally conductive housing is formed of silicon.

4. The micromachined fluid control apparatus of claim 1 wherein said thermally conductive housing has a load resistor positioned therein.

5. The micromachined fluid control apparatus of claim 1 wherein said heat source is a resistive heat source.

6. The micromachined fluid control apparatus of claim 4 wherein said heat source is a resistive heat source and is electrically connected to said load resistor such that said load resistor generates heat within said thermally conductive housing.

7. The micromachined fluid control apparatus of claim 1 wherein said heat source includes a control circuit to reduce heat output from said heat source when said heat source reaches a predetermined temperature.

8. The micromachined fluid control apparatus of claim 1 wherein said heat source includes a control circuit to reduce current flow through said heat source when current flow in said heat source reaches a predetermined value.

9. The micromachined fluid control apparatus of claim 4 further comprising a transistor to control the current driven through said load resistor and thereby control heat that is applied to said fluid within said interior void.

10. The micromachined fluid control apparatus of claim 1 further comprising an insulating substrate attached to said micromachined boiler, said insulating substrate including an aperture in fluid communication with said interior void of said housing interior surface.

11. The micromachined fluid control apparatus of claim 10 further comprising a deformable membrane attached to said insulating substrate.

12. The micromachined fluid control apparatus of claim 11 further comprising a fluid routing substrate attached to said deformable membrane, said fluid from said boiler selectively pressing against said deformable membrane to obstruct flow of a controlled fluid within said fluid routing substrate.

* * * * *